United States Patent
Tsai

(10) Patent No.: US 7,741,886 B2
(45) Date of Patent: Jun. 22, 2010

(54) FREQUENCY DIVIDER

(75) Inventor: Meng-Ting Tsai, Taichung (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 12/179,581

(22) Filed: Jul. 25, 2008

(65) Prior Publication Data

US 2009/0296878 A1    Dec. 3, 2009

(30) Foreign Application Priority Data

Jun. 3, 2008 (TW) .............................. 97120639 A

(51) Int. Cl.
*H03B 19/00* (2006.01)

(52) U.S. Cl. ...................... 327/117; 327/115

(58) Field of Classification Search .......... None
See application file for complete search history.

(56) References Cited

U.S. PATENT DOCUMENTS

| | | | |
|---|---|---|---|
| 6,404,839 B1 | 6/2002 | Fong et al. | |
| 6,501,815 B1 | 12/2002 | Stansell | |
| 6,583,647 B2 | 6/2003 | Kim et al. | |
| 6,998,882 B1 | 2/2006 | Chung | |
| 7,012,985 B1 | 3/2006 | Nix | |
| 7,521,972 B2 * | 2/2009 | Wilson et al. | ................ 327/115 |
| 7,511,581 B2 * | 3/2009 | Lee et al. | ........................ 331/34 |
| 2005/0063505 A1 | 3/2005 | Dubash et al. | |
| 2005/0242848 A1 * | 11/2005 | Sun et al. | ..................... 327/115 |
| 2006/0071717 A1 | 4/2006 | El-Kacimi et al. | |

* cited by examiner

*Primary Examiner*—Lincoln Donovan
*Assistant Examiner*—Khareem E Almo
(74) *Attorney, Agent, or Firm*—Jianq Chyun IP Office

(57) ABSTRACT

A frequency divider including a first frequency-dividing unit, a second frequency-dividing unit, a selecting unit, and a counting unit is provided. The first frequency-dividing unit receives an input signal and divides a frequency of the input signal for outputting a plurality of phase signals, wherein phases of the phase signals are mutually different. The selecting unit is connected to the first frequency-dividing unit for selecting one of the phase signals according to a control signal, so as to output an inner signal. The second frequency-dividing unit is coupled to the selecting unit for dividing a frequency of the inner signal to serve an output signal. The counting unit is coupled to the selecting unit for counting the inner signal and outputting a counting result as the control signal. Therefore, the output signal with about 50% duty cycle can be provided.

30 Claims, 6 Drawing Sheets

FREQUENCY DIVIDER

CROSS-REFERENCE TO RELATED APPLICATION

This application claims the priority benefit of Taiwan application serial no. 97120639, filed on Jun. 3, 2008. The entirety of the above-mentioned patent application is hereby incorporated by reference herein and made a part of this specification.

BACKGROUND OF THE INVENTION

1. Field of the Invention

The present invention relates to a frequency divider. More particularly, the present invention relates to a frequency divider with inner feedback.

2. Description of Related Art

With booming development of computer systems, system-on-chip (SoC) is also developed and widely used, which leads to a result that most of the present circuit designs trend to be digital systems. In a wireless communication SoC, design of a wireless transceiver thereof also trends to be an all-digital design. It is an important function for the transceiver to generate an oscillation source signal, and a circuit providing such function is naturally desired to be integrated with the digital circuit. A frequency synthesizer generally has the function of generating the oscillation source signal. Within such design field, an all digital phase-locked loop (ADPLL) has become one of the most important developing trends in recent documents. Since the digital circuit has a poor frequency-dividing performance under high frequency, the phase-locked loop (PLL) is generally implemented via an analog circuit, so as to achieve a better performance. Therefore, how to implement the analog PLL with the digital circuit and achieve an equivalent performance is an important subject for future researching.

Generally, a frequency divider is applied to the frequency synthesizer, a multimode frequency divider and a clock generator, etc. FIG. 1A is a system block diagram illustrating a conventional frequency synthesizer. Referring to FIG. 1A, the frequency synthesizer can also be referred to as the PLL. A phase-frequency detector (PFD) 101 compares a phase difference between a reference frequency $F_{ref}$ and a divided frequency of the radio frequency (RF) signal $Rf_{out}$. A charge pump (CP) 102, a low-pass filter (LPF) 103 and a voltage-controlled oscillator (VCO) 104 generate a frequency of the RF signal $Rf_{out}$ according to the phase difference. Then, the output RF signal $Rf_{out}$ is fed back to the PFD 101 via a frequency divider 105 to determine whether phases of the input reference frequency $F_{ref}$ and the RF signal $Rf_{out}$ are the same. By such means, phases of the input reference frequency $F_{ref}$ and the RF signal $Rf_{out}$ can be adjusted to be the same, so as to achieve a phase-locked function.

FIG. 1B is a system block diagram illustrating a conventional multimode frequency divider. Referring to FIG. 1B, the frequency divider 105 is also referred to as a prescaler. The frequency divider 105 receives a high frequency signal $RF_{in}$ generated by an oscillator, and generates a frequency-divided frequency to a counter 106 according to a counting result of a counter 107. The counter 106 counts the frequency-divided frequency to generate a plurality of output signals $F_m$ with different frequencies.

FIG. 1C is a system block diagram illustrating a conventional clock generator. Referring to FIG. 1C, a PLL 108 receives the reference frequency $F_{ref}$ to generate a frequency signal for the frequency divider 105, wherein the PLL 108 can be implemented via the circuit of FIG. 1A. Next, after frequency dividing performed by the frequency divider 105, a clock signal $F_{CLK}$ with a relatively low frequency is generated.

Circuits of all of the above applications include the frequency divider 105, while the frequency divider 105 can be implemented via a circuit of FIG. 1D. FIG. 1D is a system block diagram illustrating a conventional frequency divider. Referring to FIG. 1D, the frequency divider 105 is disclosed in a U.S. Pat. No. 7,012,985, in which the frequency divider 105 includes a first stage 110, a control delay circuit 112, a phase selector 114 and a dividing circuit 116. The first stage receives a non-inverting clock $CLK\_P$ and an inverting clock $CLK\_N$, and outputs different phase signals with phase differences of 90° after operation. The control delay circuit 112 and the phase selector 114 coordinate with each other to select the different phase signals as clock signals for the dividing circuit 116. Finally, the dividing circuit 116 performs the dividing operation to output a clock signal $CLK_{OUT}$.

SUMMARY OF THE INVENTION

The present invention is directed to a frequency divider, which may provide an output signal with a duty cycle about 50%.

The present invention provides a frequency divider including a first frequency-dividing unit, a second frequency-dividing unit, a selecting unit, and a counting unit. The first frequency-dividing unit receives an input signal and divides a frequency of the input signal for outputting a plurality of phase signals. The selecting unit is coupled to the first frequency-dividing unit for selecting one of the phase signals according to a control signal, so as to output an inner signal. The second frequency-dividing unit is coupled to the selecting unit for dividing a frequency of the inner signal to output an output signal. The counting unit is coupled to the selecting unit for counting the inner signal and output a counting result as the control signal.

In the frequency divider of the present invention, the inner signal output from the selecting unit is calculated by the counting unit, and the counting results thereof is taken as the control signal for outputting to the selecting unit. By such means, the frequency divider of the present invention can provide an output signal with about 50% duty cycle.

In order to make the aforementioned and other objects, features and advantages of the present invention comprehensible, a preferred embodiment accompanied with figures is described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1A:
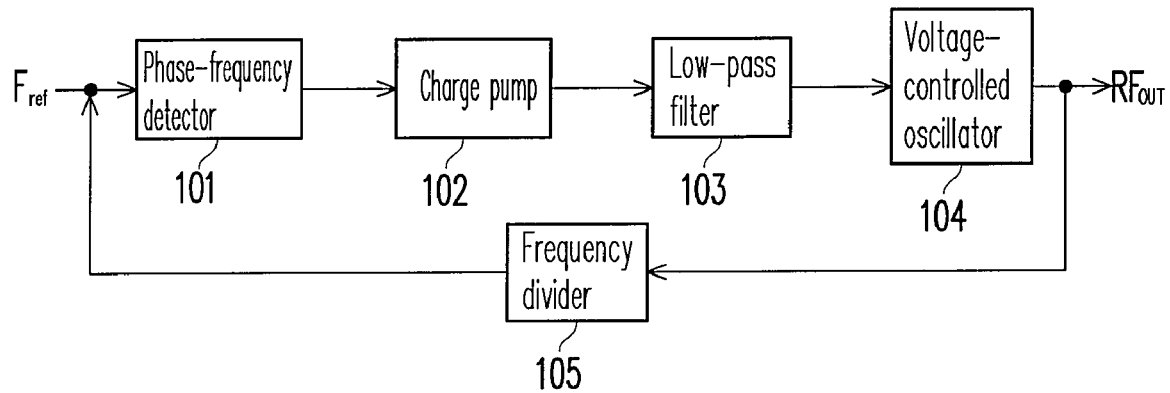
FIG. 1A is a system block diagram illustrating a conventional frequency synthesizer.
Figure 1B:
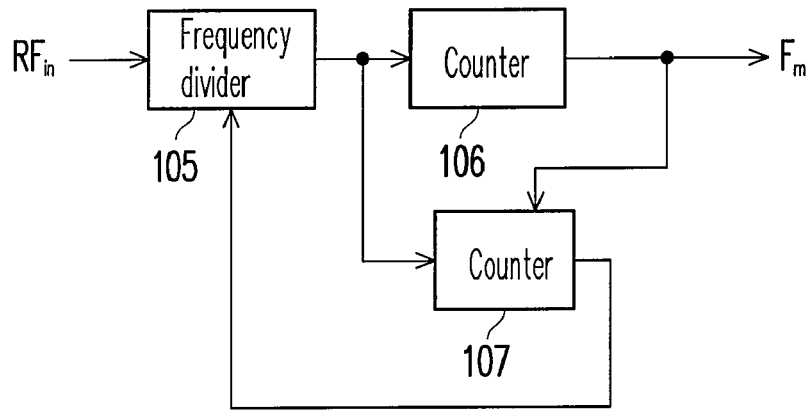
FIG. 1B is a system block diagram illustrating a conventional multimode frequency divider.
Figure 1C:
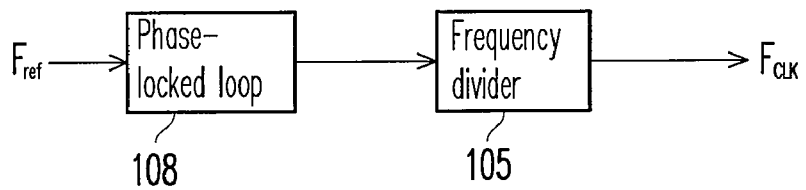
FIG. 1C is a system block diagram illustrating a conventional clock generator.
Figure 1D:
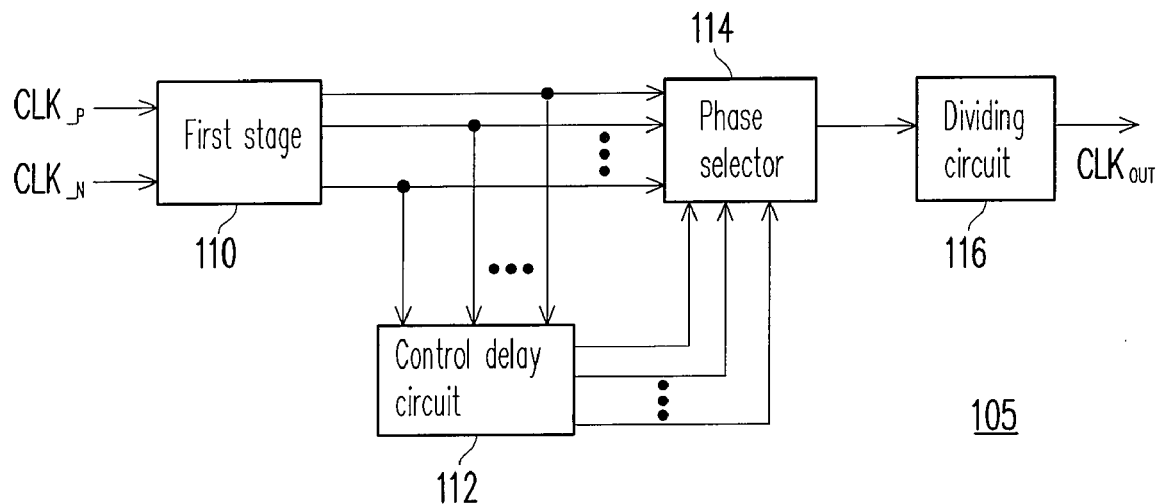
FIG. 1D is a system block diagram illustrating a conventional frequency divider.
Figure 2:
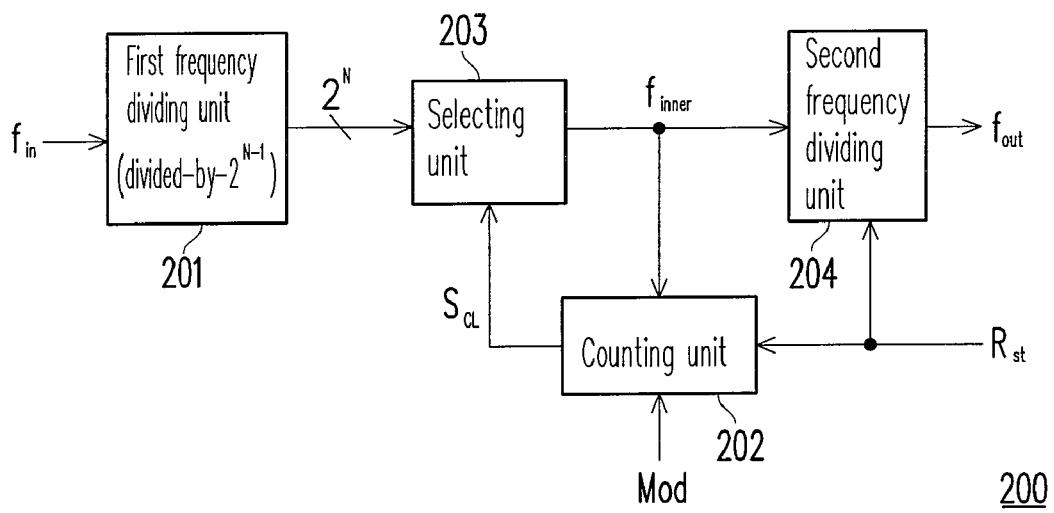
FIG. 2 is a system block diagram illustrating a frequency divider according to an embodiment of the present invention.

FIG. 2 is a system block diagram illustrating a frequency divider according to an embodiment of the present invention. Referring to FIG. 2, the frequency divider 200 includes a first frequency-dividing unit 201, a second frequency-dividing unit 204, a counting unit 202 and a selecting unit 203. The frequency-dividing unit 201 receives an input signal $f_{in}$, and divides a frequency of the input signal $f_{in}$ for outputting a plurality of phase signals. In the present embodiment, the frequency-dividing unit 201 divides a frequency of the input signal $f_{in}$ by $2^{N-1}$ to obtain $2^N$ phase signals with frequencies thereof being $f_{in}/2^{N-1}$, wherein phases of the $2^N$ phase signals are mutually different. The selecting unit 203 is coupled to the first frequency-dividing unit 201 for selecting one of the phase signals according to a control signal $S_{CL}$, so as to output an inner signal $f_{inner}$. The second frequency-dividing unit 204 is coupled to the selecting unit 203 for dividing the frequency of the inner signal $f_{inner}$ by 2 to output an output signal $f_{out}$. The counting unit 202 is coupled to the selecting unit 203 for counting the inner signal $f_{inner}$, and outputting a counting result as the control signal $S_{CL}$.

Those skilled in the art may modify the present embodiment according to an actual design requirement. For example, a control interface of a mode signal Mod can be added to the frequency divider 200, so that a counting mode of the counting unit 202 can be changed according to the mode signal Mod. For another example, a control interface of a reset signal $R_{st}$ can be added to the frequency divider 200, so that the counting unit 202 and the second frequency-dividing unit 204 can be reset according to the reset signal $R_{st}$. Therefore, the frequency divider 200 may implement a frequency divided by $2^{N-1}$, a frequency divided by $2^N$ and a frequency divided by $2^{N+1}$, etc. according to the mode signal Mod. To fully convey the spirit of the present invention to those skilled in the art, the present embodiment is described in detail in the following content.

Figure 3A:
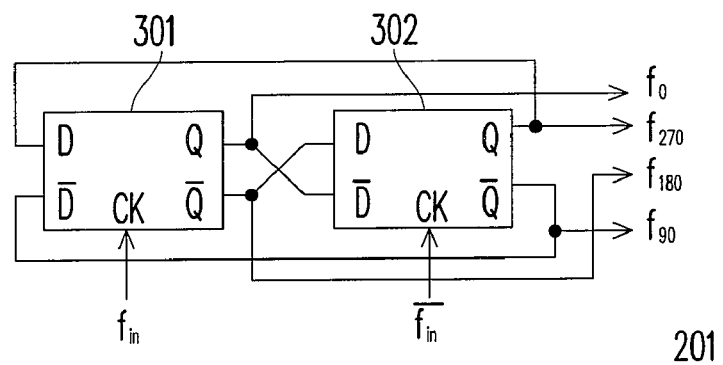
FIG. 3A is a circuit diagram illustrating a first frequency-dividing unit of FIG. 2 according to an embodiment of the present invention.

The aforementioned N value can be determined according to the actual design requirement. In the following content, N=2 is taken as an example for describing the embodiment of FIG. 2 in detail. FIG. 3A is a circuit diagram illustrating the first frequency-dividing unit 201 of FIG. 2 according to an embodiment of the present invention. Referring to FIG. 3A, the frequency-dividing unit 201 includes a first latch 301 and a second latch 302. Assuming the first latch 301 and the second latch 302 are all D-type latches. The first and second latches 301 and 302 respectively have a trigger terminal CK, a non-inverting input terminal D, an inverting input terminal $\overline{D}$, a non-inverting output terminal Q and an inverting output terminal $\overline{Q}$. The trigger terminal CK of the latch 301 receives the input signal $f_{in}$, and the trigger terminal CK of the latch 302 receives an inverted signal $\overline{f_{in}}$ of the input signal $f_{in}$. The non-inverting input terminal D of the latch 302 is coupled to the inverting output terminal $\overline{Q}$ of the latch 301. The inverting input terminal $\overline{D}$ of the latch 302 is coupled to the non-inverting output terminal Q of the latch 301. The non-inverting output terminal Q of the latch 302 is coupled to the non-inverting input terminal D of the latch 301. The inverting output terminal $\overline{Q}$ of the latch 302 is coupled to the inverting input terminal $\overline{D}$ of the latch 301.

Figure 3B:
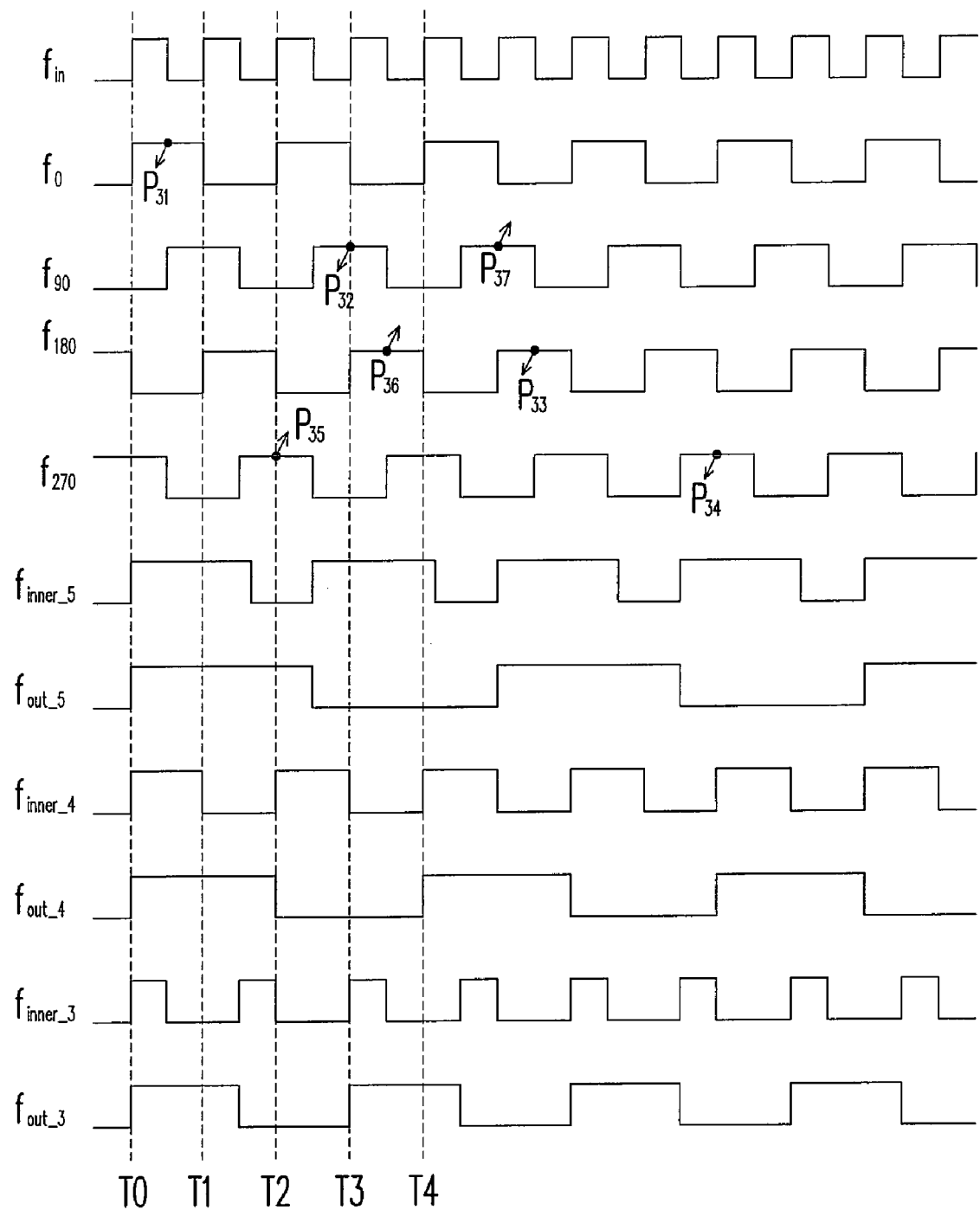
FIG. 3B is waveform diagram of the signals of FIG. 3A and FIG. 4 according to an embodiment of the present invention.
Figure 4:
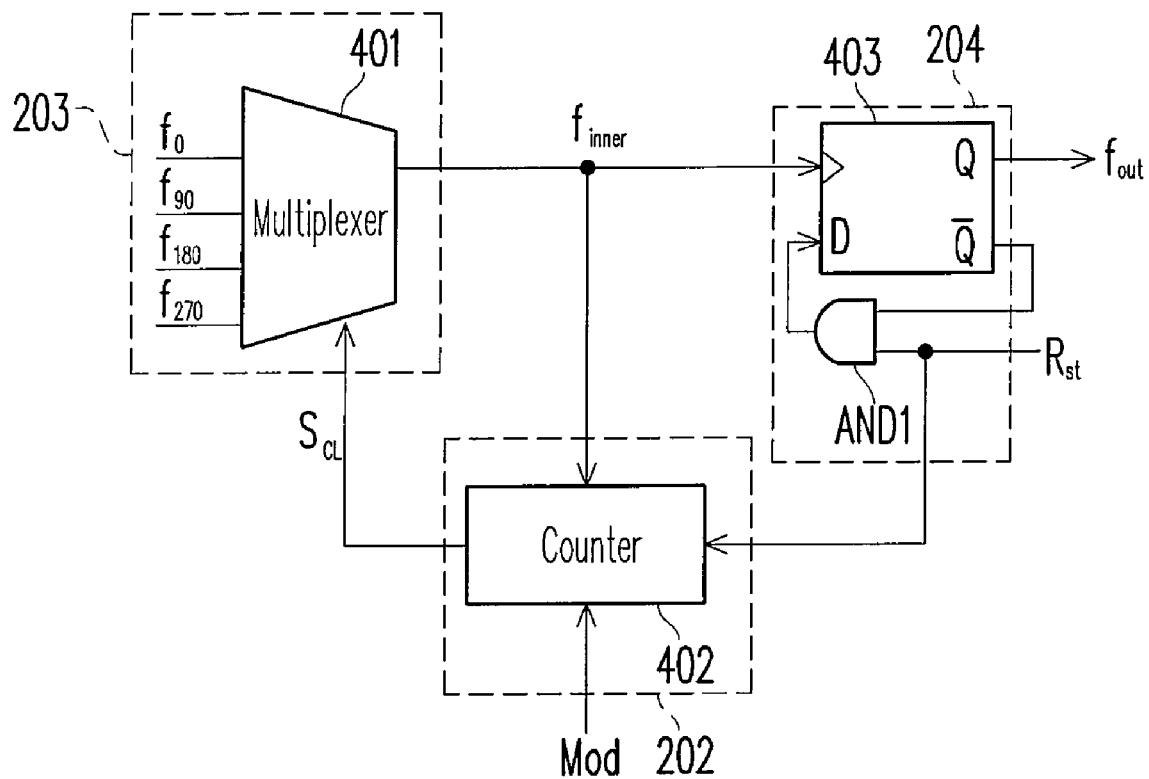
FIG. 4 is a circuit diagram illustrating a second frequency-dividing unit, a counting unit and a selecting unit according to an embodiment of the present invention.

FIG. 3B is waveform diagram of the signals of FIG. 3A and FIG. 4 according to an embodiment of the present invention. Referring to FIG. 3A and FIG. 3B, the non-inverting output terminal Q of the D-type latch 301 provides a phase signal $f_0$, and the inverting output terminal $\overline{Q}$ thereof provides a phase signal $f_{180}$. The non-inverting output terminal Q of the D-type latch 302 provides a phase signal $f_{270}$, and the inverting output terminal $\overline{Q}$ thereof provides a phase signal $f_{90}$. The phases of the signals $f_0$, $f_{90}$, $f_{180}$ and $f_{270}$ are mutually different. In the present embodiment, if the phase signal $f_0$ represents an output signal with 0° phase difference, the phase signal $f_{90}$ then represents an output signal with 90° phase difference, and the phase signals $f_{180}$ and $f_{270}$ respectively represent phase differences thereof being 180° and 270°. Waveforms of the phase signals are shown as the phase signals $f_0$, $f_{90}$, $f_{180}$ and $f_{270}$ of FIG. 3B. In the following content, how the phase differences of the phase signals $f_0$, $f_{90}$, $f_{180}$ and $f_{270}$ are generated is described.

Accordingly, description is first started from time T0 of FIG. 33B, and assuming that before the time T0, levels of the phase signals $f_0$ and $f_{90}$ are "0" (i.e. logical levels thereof are 0), and levels of the phase signals $f_{180}$ and $f_{270}$ are "1" (i.e. logical levels thereof are 1). If a level of the input signal $f_{in}$ is changed from "0" to "1", the D-type latch 302 is not triggered, and an output thereof maintains unchanged, while the D-type latch 301 is triggered, so that the output of the D-type latch 302 is recorded to internal of the latch 301. Namely, the levels of the phase signals $f_0$ and $f_{270}$ are all "1", and the levels of the phase signals $f_{180}$ and $f_{90}$ are all "0". Therefore, the level of the phase signal $f_0$ is changed from "0" to "1", and the level of the phase signal $f_{180}$ is changed from "1" to "0".

If the level of the input signal $f_{in}$, is changed from "1" to "0", the D-type latch 301 is not triggered, and an output thereof maintains unchanged, while the D-type latch 302 is triggered, so that the output of the D-type latch 301 is taken as the output of the latch 302. Namely, the levels of the phase signals $f_0$ and $f_{90}$ are all "1", and the levels of the phase signals $f_{180}$ and $f_{270}$ are all "0". Therefore, the level of the phase signal $f_{90}$ is changed from "0 to 1", and the level of the phase signal $f_{270}$ is changed from "1" to "0".

Next, after time T1, if the level of the input signal $f_{in}$ is again changed from "0" to "1", operations of the D-type latches 301 and 302 are the same as above description, while the levels of the phase signals $f_0$ and $f_{270}$ are all "0", and the levels of the phase signals $f_{180}$ and $f_{90}$ are all "1", wherein the level of the phase signal $f_0$ is changed from "1" to "0", and the level of the phase signal $f_{180}$ is changed from "0" to "1".

If the level of the input signal $f_{in}$ is again changed from "1" to "0", operations of the D-type latches 301 and 302 are the same as above description, while the levels of the phase signals $f_0$ and $f_{90}$ are all "0", and the levels of the phase signals $f_{180}$ and $f_{270}$ are all "1", wherein the level of the phase signal $f_{90}$ is changed from "1" to "0", and the level of the phase signal $f_{270}$ is changed from "0" to "1".

After time T2, variations of the waveforms during the time T2 and T3 is changed back as that during the time T0 and T1, and variations of the waveforms during the time T3 and T4 is changed back as that during the time T1 and T2. Variations of the waveforms during other time intervals can be deduced by analogy. Therefore, the frequency-dividing unit 201 may achieve an effect of dividing the frequencies by 2, and the phase signals $f_0$, $f_{90}$, $f_{180}$ and $f_{270}$ may sequentially have the 90° phase difference.

After the frequency-dividing unit 201 outputs the phase signals $f_0$, $f_{90}$, $f_{180}$ and $f_{270}$, the phase signals are processed by the selecting unit 203, the counting unit 202 and the frequency-dividing unit 204 to output the output signal $f_{out}$ of the frequency divider 200. FIG. 4 is a circuit diagram illustrating a second frequency-dividing unit, a counting unit and a selecting unit according to an embodiment of the present invention. Referring to FIG. 4, in the present embodiment, the selecting unit 203 is implemented by a multiplexer 401, the counting unit 202 is implemented by a counter 402, and the frequency-dividing unit 204 is implemented by a flip-flop 403 and an AND gate AND1. Assuming the flip-flop 403 is a D-type flip-flop.

Accordingly, the multiplexer 401 respectively receives the phase signals $f_0$, $f_{90}$, $f_{180}$ and $f_{270}$ from the frequency-dividing unit 201, and selects one of the phase signals as the inner signal $f_{inner}$ according to the control signal $S_{CL}$, wherein the control signal $S_{CL}$ is assumed to be a two-bit signal for mapping to the four inputs of the multiplexer 401. The counter 402 is coupled to an output terminal of the multiplexer 401 for receiving the inner signal $f_{inner}$, and counting the inner signal $f_{inner}$ according to a counting mode set based on the mode signal Mod. Thereafter, a counting result thereof is taken as the control signal $S_{CL}$ and provided to the multiplexer 401. Assuming the counter 402 is operated based on the aforementioned counting mode, if the counting result is "00", the multiplexer 401 then selects and outputs the phase signal $f_0$ as the inner signal $f_{inner}$ according to the control signal $S_{CL}$; if the counting result is "01", the multiplexer 401 then selects and outputs the phase signal $f_{90}$ according to the control signal $S_{CL}$; if the counting result is "10", the multiplexer 401 then selects and outputs the phase signal $f_{180}$ according to the control signal $S_{CL}$; if the counting result is "11", the multiplexer 401 then selects and outputs the phase signal $f_{270}$ according to the control signal $S_{CL}$. Next, the counting result of the counter 402 is back to "00".

Moreover, the counter 402 can also receive the reset signal $R_{st}$, and when the reset signal $R_{st}$ is enabled (assuming a logical level thereof is 0), the counting result of the counter 402 is then reset (reset to 0). In the present embodiment, assuming the mode signal Mod of the counter 402 is the two-bit signal, if the mode signal Mod is "00" or "11", the counter 402 does not count (maintains the counting result); if the mode signal Mod is "01", the counter 402 then counts upwards; if the mode signal Mod is "10", the counter 402 then counts downwards. The mode signal Mod can be set via a dip switch (not shown) or other electronic input devices (not shown) and transmitted to the counter 402.

Referring to FIG. 4, the trigger terminal of the D-type flip-flop 403 is coupled to the output terminal of the multiplexer 401. A signal of the non-inverting input terminal D of the D-type flip-flop 403 is transmitted to the non-inverting output terminal Q thereof to output the output signal $f_{out}$, when the level of the inner signal $f_{inner}$ is changed from "0" to "1". The non-inverting input terminal D of the flip-flop 403 is coupled to an output terminal of the AND gate AND1, and the inverting output terminal $\overline{Q}$ is coupled to a first input terminal of the AND gate AND1. A second input terminal of the AND gate AND1 receives the reset signal $R_{st}$. When the reset signal $R_{st}$ is enabled, namely, a level of the signal received by the second input terminal of the AND gate AND1 is "0", regardless of a level of a signal received by the first input terminal being "0" or "1", a level of the signal output from the AND gate AND1 is maintained to be "0". Therefore, after the D-type flip-flop 403 is triggered, the level of the output signal $f_{out}$ of the flip-flop 403 is maintained to be "0". When the reset signal $R_{st}$ is disabled (assumed to be logical level 1 herein), the level of the signal received by the second input terminal of the AND gate AND1 is "1", and the signal received by the first input terminal of the AND gate AND1 is then transmitted to the output terminal of the AND gate AND1. Therefore, the signal output from the inverting output terminal $\overline{Q}$ of the D-type flip-flop 403 is transmitted to the non-inverting input terminal D via the AND gate AND1 to serve as the output signal $f_{out}$ for a next triggering. Accordingly, the second frequency-dividing unit 204 provides the "toggle" output signal $f_{out}$ each time when the frequency-dividing unit 204 is triggered, i.e. provides frequency dividing-by-2 capability to the trigged signal.

Referring to FIG. 3B and FIG. 4, when the mode signal Mod is "00" or "11", the counter 402 does not count, so that the control signal $S_{CL}$ is maintained to a certain value. Therefore, the multiplexer 401 fixedly selects and outputs one of the phase signals $f_0$, $f_{90}$, $f_{180}$ and $f_{270}$ under controller of the control signal $S_{CL}$, wherein the selection is performed according to a previous counting result (i.e. the control signal $S_{CL}$). Under such a counting mode, the counting result of the counter 402 is maintained to the certain value (assumed to be "00" herein). Therefore, the multiplexer 401 fixedly outputs the phase signal $f_0$ as the inner signal $f_{inner}$ under control of the control signal $S_{CL}$. The frequency of the inner signal $f_{inner}$ (i.e. the phase signal $f_0$) is equal to the frequency of the input signal $f_{in}$ divided by 2, and the waveform of the inner signal $f_{inner}$ is as the waveform $f_{inner\_4}$ of FIG. 3B. The frequency-dividing unit 204 divides the frequency of the inner signal $f_{inner}$ by 2 and outputs the output signal $f_{out}$ which is equal to the frequency of the input signal $f_{in}$ divided by 4, and the waveform of the output signal $f_{out}$ is as the waveform $f_{inner\_4}$ of FIG. 3B. Therefore, the frequency divider 200 under such counting mode is a divided-by-4 frequency divider.

When the mode signal Mod received by the counter 402 is "01", the counter 402 counts upwards (a counting sequence thereof is 00, 01, 10, 11 and back to 00), and the multiplexer 401 then sequentially outputs the phase signals $f_0$, $f_{90}$, $f_{180}$ and $f_{270}$ as the inner signal $f_{inner}$. In case of such mode, the waveform of the inner signal $f_{inner}$ is then as the waveform $f_{inner\_5}$ of FIG. 3B. Assuming the counting result "00" is first applied, namely, the multiplexer 401 first outputs the phase signal $f_0$ as the inner signal $f_{inner}$. At the time T0, when the level of the inner signal $f_{inner}$ is changed from "0" to "1", the counting result (the control signal $S_{CL}$) of the counter 402 is added with 1 (the counting result is changed to 01). During an actual high frequency application, triggering operation (transition of the control signal $S_{CL}$) of the counter 402 and switching operation of the multiplexer 401 require a period of reaction time. Therefore, during the high frequency application, the multiplexer 401 is generally delayed to a time point $P_{31}$ for switching the phase signal $f_0$ to the next phase signal $f_{90}$ to serve as the inner signal $f_{inner}$. Next, between the time T2 and the time T3, when the level of the inner signal $f_{inner}$ (having the waveform thereof as the waveform $f_{inner\_5}$ of FIG. 3B) is changed from "0" to "1" along with the phase signal $f_{90}$, the counting result (the control signal $S_{CL}$) of the counter 402 is then changed to "10". After the period of reaction time, the multiplexer 401 is delayed to a time point $P_{32}$ for switching the phase signal $f_{90}$ to the next phase signal $f_{180}$ to serve as the inner signal $f_{inner}$. Deduced by analogy, the multiplexer 401 is delayed to a time point $P_{33}$ for switching the phase signal $f_{180}$ to the next phase signal $f_{270}$ to serve as the inner signal $f_{inner}$, and is delayed to a time point $P_{34}$ for switching the phase signal $f_{270}$ to the next phase signal $f_0$ to serve as the inner signal $f_{inner}$. By such means, the frequency of the inner signal $f_{inner}$ is equal to the frequency of the input signal $f_{in}$ divided by 2.5. Under such counting mode, after frequency of the output signal $f_{out}$ is divided by the frequency-dividing unit 204, a result thereof is equal to the frequency of the input signal $f_{in}$ divided by 5. The waveform of the output signal $f_{out}$ is as the waveform $f_{out\_5}$ of FIG. 3B. Therefore, the frequency divider 200 under such counting mode is a divided-by-5 frequency divider.

When the mode signal Mod received by the counter 402 is "10", the counter 402 counts downwards (a counting sequence thereof is 00, 11, 10, 01 and back to 00), and the multiplexer 401 then sequentially outputs the phase signals $f_0$, $f_{270}$, $f_{180}$ and $f_{90}$ as the inner signal $f_{inner}$. In case of such mode, the waveform of the inner signal $f_{inner}$ is then as the waveform $f_{inner\_3}$ of FIG. 3B. Assuming the counting result "00" is first applied, namely, the multiplexer 401 first outputs the phase signal $f_0$ as the inner signal $f_{inner}$. At the time T0, when the level of the inner signal $f_{inner}$ is changed from "0" to "1", the counting result (the control signal $S_{CL}$) of the counter 402 descends 1 (the counting result is changed to 11). Similarly, under such mode, the aforementioned reaction time still exists. Therefore, after the period of reaction time, the multiplexer 401 switches the phase signal $f_0$ to the next phase signal $f_{270}$ to serve as the inner signal $f_{inner}$ at the time point $P_{31}$. Next, between the time T1 and the time T2, when the level of the inner signal $f_{inner}$ (having the waveform thereof as the waveform $f_{inner\_3}$ of FIG. 3B) is changed from "0" to "1" along with the phase signal $f_{270}$, the counting result (the control signal $S_{CL}$) of the counter 402 is then changed to "10". After the period of reaction time, the multiplexer 401 switches the phase signal $f_{270}$ to the next phase signal $f_{180}$ to serve as the inner signal $f_{inner}$ at the time point $P_{35}$. Deduced by analogy, the multiplexer 401 switches the phase signal $f_{180}$ to the next phase signal $f_{90}$ to serve as the inner signal $f_{inner}$ at the time portion $P_{36}$, and switches the phase signal $f_{90}$ to the next phase signal $f_0$ to serve as the inner signal $f_{inner}$ at the time point $P_{37}$. By such means, the frequency of the inner signal $f_{inner}$ is equal to the frequency of the input signal $f_{in}$ divided by 1.5. Under such counting mode, after the frequency of the output signal $f_{out}$ is divided by the frequency-dividing unit 204, a result thereof is equal to the frequency of the input signal $f_{in}$ divided by 3. The waveform of the output signal $f_{out}$ is as the waveform $f_{out\_3}$ of FIG. 3B. Therefore, the frequency divider 200 under such counting mode is a divided-by-3 frequency divider.

According to the above description, the counting mode of the counter 402 is changed according to the mode signal Mod. Therefore, the frequency divider 200 of the present embodiment may achieve a 3-mode (divided-by-3, divided-by-4, divided-by-5) frequency dividing effect, and may provide the output signal $f_{out}$ with a duty cycle about 50%.

Figure 5:
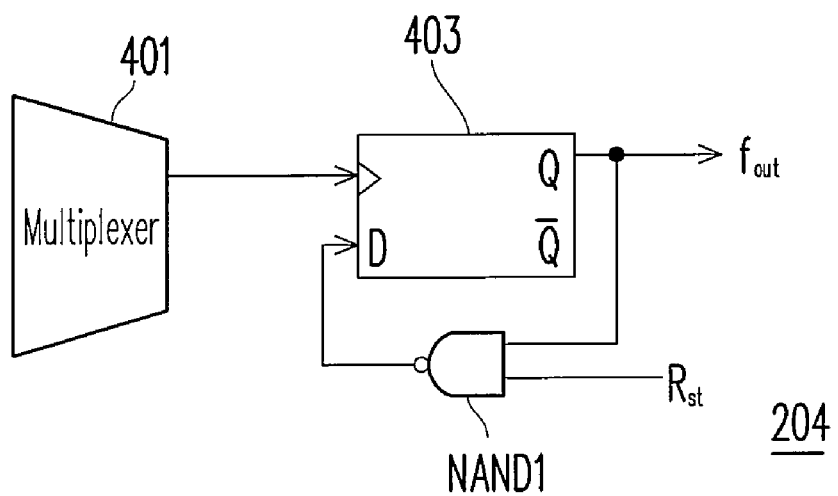
FIG. 5 is a circuit diagram illustrating a second frequency-dividing unit of FIG. 4 according to another embodiment of the present invention.

Besides, the frequency-dividing unit 204 can also be implemented by an embodiment of FIG. 5. FIG. 5 is a circuit diagram illustrating a second frequency-dividing unit of FIG. 4 according to another embodiment of the present invention. Referring to FIG. 4 and FIG. 5, a greatest difference there between is that an NAND gate NAND1 is applied, and a first input terminal thereof is coupled to the non-inverting output terminal Q of the D-type flip-flop 403. When the reset signal is enabled, namely, level of a signal received by a second input terminal of the NAND gate NAND1 is 0, regardless of a level of a signal received by the first input terminal of the NAND gate NAND1 being "0" or "1", a level of the signal output from the NAND gate NAND1 is maintained to be "1". Therefore, after the D-type flip-flop 403 is triggered, the level of the output signal $f_{out}$ of the flip-flop 403 is maintained to be "1". When the reset signal $R_{st}$ is disabled (assumed to be logical level 1 herein), the level of the signal received by the second input terminal of the NAND gate NAND1 is "1", and an inverted signal of the signal received by the first input terminal of the NAND gate NAND1 is then transmitted to an output terminal of the NAND gate NAND1. Therefore, an inverted signal $\overline{Q}$ of the signal output from the non-inverting output terminal Q of the D-type flip-flop 403 is transmitted to the non-inverting input terminal D of the D-type flip-flop 403 via the NAND gate NAND1 to serve as the output signal $f_{out}$ for a next triggering. Accordingly, the second frequency-dividing unit 204 provides the "toggle" output signal $f_{out}$ each time when the frequency-dividing unit 204 is triggered, i.e. provides frequency dividing-by-2 capability to the trigged signal.

Figure 6:
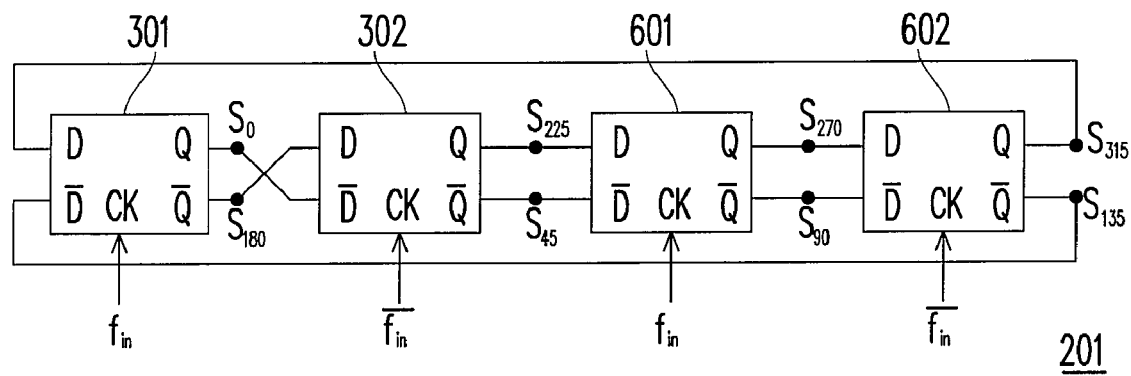
FIG. 6 is a circuit diagram illustrating a first frequency-dividing unit of FIG. 2 according to another embodiment of the present invention.

According to the related description of FIG. 2, the frequency-dividing unit 201 can divide the frequency of the input signal $f_{in}$ by $2^{N-1}$ to obtain $2^N$ phase signals with frequencies thereof being $f_{in}/2^{N-1}$. Therefore, the frequency divider 200 may implement a frequency dividing by $(2^{N-1})$, a frequency dividing by $(2^N)$, and a frequency dividing by $(2^N+1)$, etc. according to the mode signal Mod. Those skilled in the art can determine the N value according to an actual design requirement. For example, N=3 is taken as an example to describe the embodiment of FIG. 2 in detail. FIG. 6 is a circuit diagram illustrating a first frequency-dividing unit 201 of FIG. 2 according to another embodiment of the present invention. Referring to FIG. 6, the frequency-dividing unit 201 includes latches 301, 302, 601 and 602. Assuming the latches 301, 302, 601 and 602 are all D-type latches. The D-type latches 301, 302, 601 and 602 respectively have an trigger terminal CK, a non-inverting input terminal D, an inverting input terminal $\overline{D}$, a non-inverting output terminal Q and an inverting output terminal $\overline{Q}$. Wherein, the trigger terminals CK of the D-type latches 301 and 601 receive the input signal $f_{in}$, and the trigger terminals CK of the D-type latches 302 and 602 receive an inverted signal $\overline{f_{in}}$ of the input signal $f_{in}$. The non-inverting input terminal D of the latch 302 is coupled to the inverting output terminal $\overline{Q}$ of the latch 301, and the inverting input terminal $\overline{D}$ of the latch 302 is coupled to the non-inverting output terminal Q of the latch 301.

The non-inverting input terminal D of the latch 601 is coupled to the non-inverting output terminal Q of the latch 302, and the inverting input terminal $\overline{D}$ of the latch 601 is coupled to the inverting output terminal $\overline{Q}$ of the D-type latch 302. The non-inverting input terminal D of the latch 602 is coupled to the non-inverting output terminal Q of the latch 601, and the inverting input terminal $\overline{D}$ of the latch 602 is coupled to the inverting output terminal $\overline{Q}$ of the latch 601. The non-inverting output terminal Q of the latch 602 is coupled to the non-inverting input terminal D of the latch 301, and the inverting output terminal $\overline{Q}$ of the latch 602 is coupled to the inverting input terminal $\overline{D}$ of the latch 301.

Here, the non-inverting output terminals Q of the latches 301, 302, 601 and 602 are defined to respectively output phase signals $S_0$, $S_{225}$, $S_{270}$ and $S_{315}$, and the inverting output terminals $\overline{Q}$ thereof respectively output the phase signals $S_{180}$, $S_{45}$, $S_{90}$ and $S_{135}$. Phases of the phase signals $S_0$, $S_{45}$, $S_{90}$, $S_{135}$, $S_{180}$, $S_{225}$, $S_{270}$ and $S_{315}$ sequentially have difference of 45°. A principle for generating the phase difference is the same to that of the embodiment of FIG. 3A, and therefore detailed description thereof will not be repeated. Accordingly, in coordination with the second frequency-dividing unit 204, the counting unit 202 and the selecting unit 203, more selection of frequency dividing multiple can be provided.

The counting unit 202 counts the inner signal $f_{inner}$ according to the counting mode set based on the mode signal Mod, and the counting result thereof serves as the control signal $S_{CL}$, and is provided to the selecting unit 203. Those skilled in the art can define the counting mode of the counting unit 202 according to the actual design requirements. For example, the counting mode may include an upward mode, a downward mode, and a maintaining mode (maintain the counting result unchanged). For another example, if the counting unit 202 is operated under the upward mode, the output counting results thereof (the control signal $S_{CL}$) can be "0", "1", "2", "3", "4", "5", "6", "7", "0", . . . etc. (i.e. the counting result is added with 1 for each triggering), or can be "0", "2", "4", "6", "0", . . . etc. (i.e. the counting result is added with 2 for each triggering). In other words, under control of the mode signal Mod, each time when the counting unit 202 is triggered by the inner signal $f_{inner}$, the counting result thereof is then added with a certain integer (any integer determined according to the actual design requirement). Again for an example, if the counting unit 202 is operated under the downward mode, the output counting results thereof (the control signal $S_{CL}$) can be "0", "7", "6", "5", "4", "3", "2", "1", "0", . . . etc. (i.e. the counting result is decreased with 1 for each triggering), or can be "0", "6", "4", "2", "0", . . . etc. (i.e. the counting result is decreased with 2 for each triggering). Namely, under control of the mode signal Mod, each time when the counting unit 202 is triggered by the inner signal $f_{inner}$, the counting result thereof is then decreased with a certain integer (any integer determined according to the actual design requirement).

Accordingly, if the counting unit 202 is operated under the upward mode, and the counting result thereof is added with 1 for each triggering, the output counting results are then "0", "1", "2", "4", "5", "6", "7", and the selecting unit 203 then sequentially outputs the phase signals $S_0$, $S_{45}$, $S_{90}$, $S_{135}$, $S_{180}$, $S_{225}$, $S_{270}$ and $S_{315}$ to serve as the inner signal $f_{inner}$ according to the control signal $S_{CL}$, and now the frequency of the inner signal $f_{inner}$ is equal to the frequency of the input signal $f_{in}$ divided by 4.5. Under such counting mode, frequency of the output signal $f_{out}$ being processed by the frequency-dividing unit 204 is equal to the frequency of the input signal $f_{in}$ divided by 9. Therefore, under such counting mode, the frequency divider 200 is a divided-by-9 frequency divider.

Conversely, if the counting unit 202 is operated under the downward mode, and the counting result thereof is decreased with 1 for each triggering, the output counting results are then "7", "6", "5", "4", "3", "2", "1", "0", and the selecting unit 203 then sequentially outputs the phase signals $S_{315}$, $S_{270}$, $S_{225}$, $S_{180}$, $S_{135}$, $S_{90}$, $S_{45}$ and $S_0$ to serve as the inner signal $f_{inner}$ according to the control signal $S_{CL}$, and now the frequency of the inner signal $f_{inner}$ is equal to the frequency of the input signal $f_{in}$ divided by 3.5. Under such counting mode, frequency of the output signal $f_{out}$ being processed by the frequency-dividing unit 204 is equal to the frequency of the input signal $f_{in}$ divided by 7. Therefore, under such counting mode, the frequency divider 200 is a divided-by-7 frequency divider.

Moreover, if the counting unit 202 is operated under the upward mode, and the counting result thereof is added with 2 for each triggering, the output counting results are then "0", "2", "4", "6", "0", and the selecting unit 203 then sequentially outputs the phase signals $S_0$, $S_{90}$, $S_{180}$ and $S_{270}$ to serve as the inner signal $f_{inner}$ according to the control signal $S_{CL}$, and now the frequency of the inner signal $f_{inner}$ is equal to the frequency of the input signal $f_{in}$ divided by 5. Under such counting mode, frequency of the output signal $f_{out}$ being processed by the frequency-dividing unit 204 is equal to the frequency of the input signal $f_{in}$ divided by 10. Therefore, under such counting mode, the frequency divider 200 is a divided-by-10 frequency divider.

Conversely, if the counting unit 202 is operated under the downward mode, and the counting result thereof is decreased with 2 for each triggering, the output counting results are then "0", "6", "4", "2", "0", and the selecting unit 203 then sequentially outputs the phase signals $S_{270}$, $S_{180}$, $S_{90}$ and $S_0$ to serve as the inner signal $f_{inner}$ according to the control signal $S_{CL}$, and now the frequency of the inner signal $f_{inner}$ is equal to the frequency of the input signal $f_{in}$ divided by 3. Under such counting mode, frequency of the output signal $f_{out}$ being processed by the frequency-dividing unit 204 is equal to the frequency of the input signal $f_{in}$ divided by 6. Therefore, under such counting mode, the frequency divider 200 is a divided-by-6 frequency divider.

Accordingly, the counting unit 202 can change the counting mode thereof according to the mode signal Mod, and based on variation of the counting mode, the counting unit 202 can provide the output signal with different frequency dividing multiples.

Figure 7:
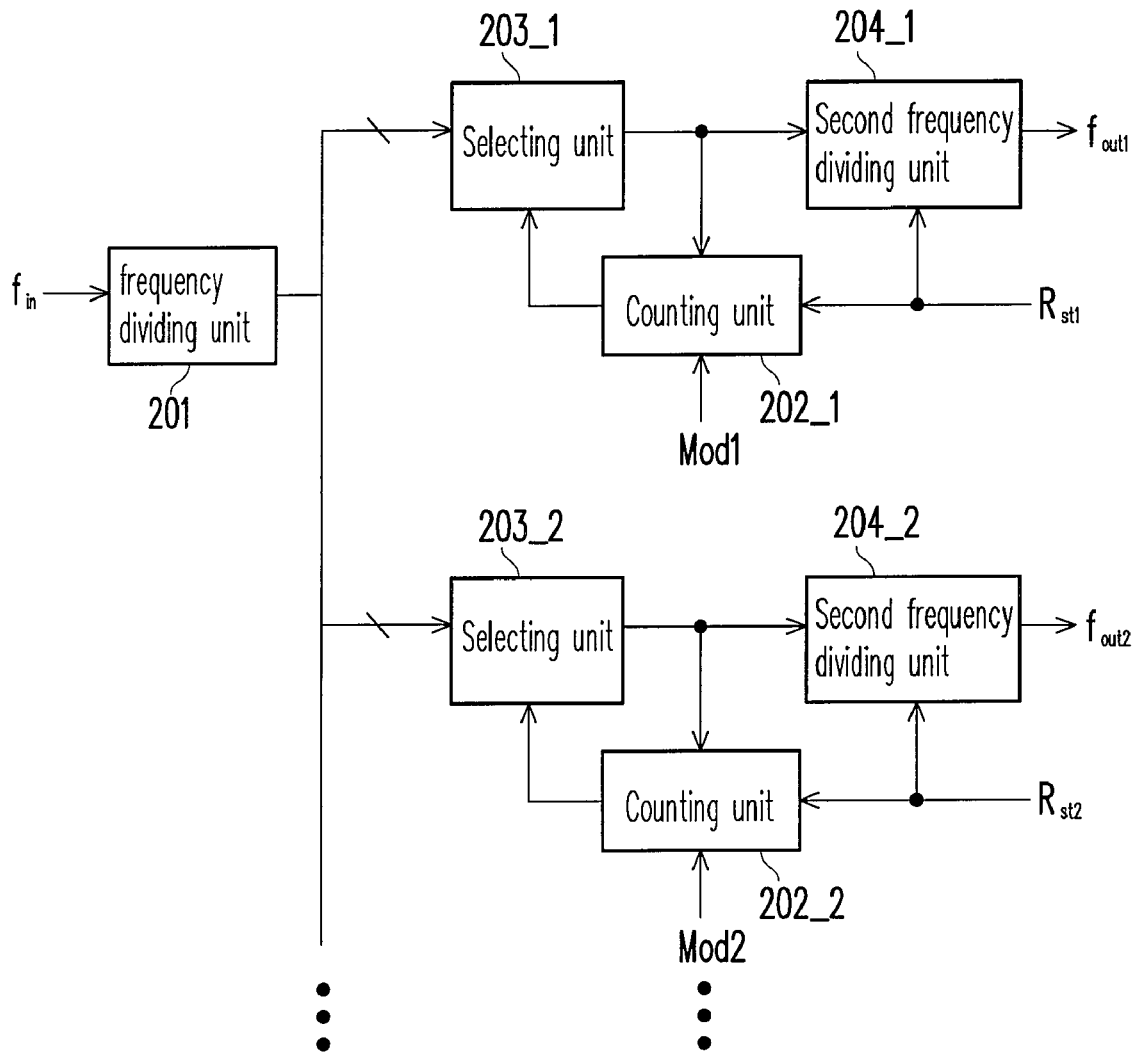
FIG. 7 is a system block diagram illustrating a multimode frequency divider according to an embodiment of the present invention.

Besides, the aforementioned embodiment can be expended to provide more functions. In the following content, other embodiments are provided for detail description. FIG. 7 is a system block diagram illustrating a multimode frequency divider according to an embodiment of the present invention. Referring to FIG. 2 and FIG. 7, the difference there between is that the selecting unit, the counting unit and the second frequency-dividing unit can be expended via modularisation. In FIG. 7, each module can be individually implemented by the embodiment of FIG. 4, and the counting mode of each module can be defined according to their own mode signals Mod_1, Mod_2, . . . etc. By such means, the output signals $f_{out1}$, $f_{out2}$, . . . etc. with different frequency dividing multiples can be simultaneously provided.

Figure 8:
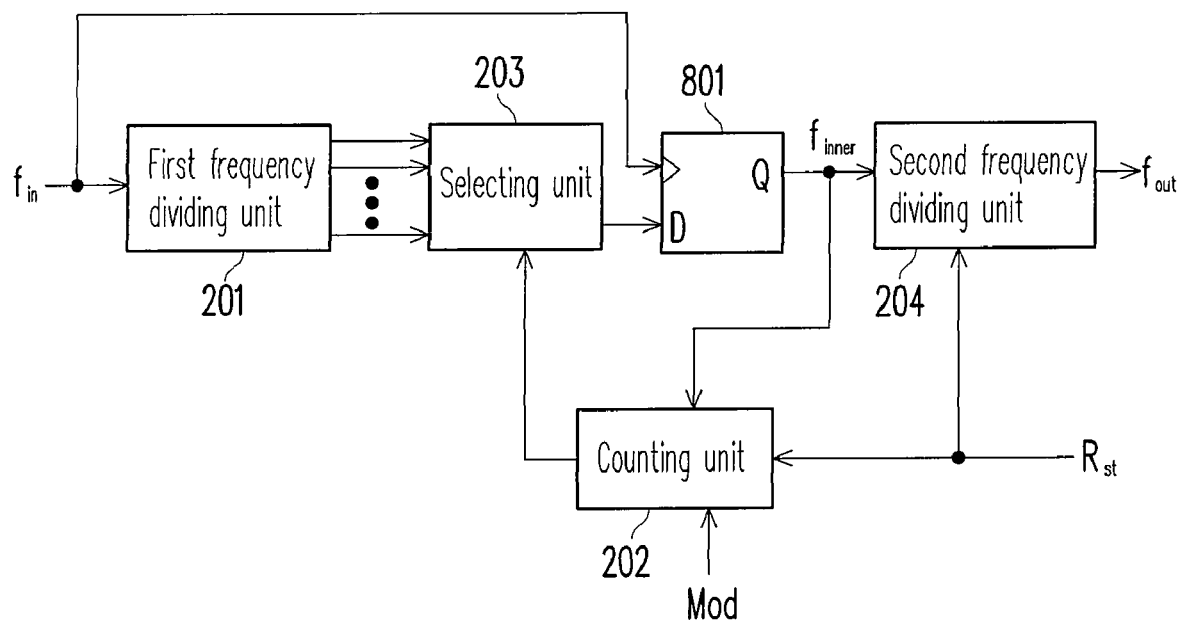
FIG. 8 is a system block diagram illustrating a frequency divider according to another embodiment of the present invention.

FIG. 8 is a system block diagram illustrating a frequency divider according to another embodiment of the present invention. Referring to FIG. 2 and FIG. 8, the difference there between is that a flip-flop 801 is connected between the selecting unit 203 and the second frequency-dividing unit 204. Assuming the flip-flop 801 is D-type flip-flop. The flip-flop 801 includes a trigger terminal, a non-inverting input terminal D and a non-inverting output terminal Q. The trigger terminal of the D-type flip-flop 801 receives the input signal $f_{in}$. The non-inverting input terminal D of the D-type flip-flop 801 is coupled to the output terminal of the selecting unit 203 for latching the output signal of the selecting unit 203 according to triggering of the input signal $f_{in}$, and outputting a latching result to serve as the inner signal $f_{inner}$. The non-inverting output terminal Q of the D-type flip-flop 801 outputs the inner signal $f_{inner}$ to the second frequency-dividing unit 204 and the counting unit 202. In some embodiments, the inner signal $f_{inner}$ may be influenced when the selecting unit 203 switches and outputs signals. Therefore, the D-type flip-flop 801 is used for blocking the selecting unit 203 and the inner signal $f_{inner}$, so as to eliminate the influence of the inner signal $f_{inner}$ generated when the selecting unit 203 switches and outputs signals.

It should be noted that in the other embodiments, the aforementioned embodiments can be applied to the conventional frequency synthesizer, the multimode frequency divider and the clock generator. The duty cycle of the output signal of the above embodiment can also be adjusted according to actual requirement.

In summary, the frequency divider of the present invention has at least the following advantages. The output signal with about 50% duty cycle can be provided; the different frequency dividing ratios according to different actual requirements can be provided; while with the same input signal, the output signals with different frequency ratios can be simultaneously provided; the influence generated when the selecting unit switches and outputs signals can be totally eliminated; and the aforementioned embodiments can be implemented by simple devices, so as to save a hardware cost.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A frequency divider, comprising:
    a first frequency-dividing unit, for receiving an input signal, and dividing a frequency of the input signal to output a plurality of phase signals, wherein phases of the phase signals are mutually different, wherein the first frequency-dividing unit comprises:
        a first latch, having a trigger terminal, a non-inverting input terminal, an inverting input terminal, a non-inverting output terminal and an inverting output terminal, wherein the trigger terminal of the first latch receives the input signal; and
        a second latch, having a trigger terminal, a non-inverting input terminal, an inverting input terminal, a non-inverting output terminal and an inverting output terminal, wherein the trigger terminal of the second latch receives an inverted signal of the input signal, the non-inverting input terminal of the second latch is coupled to the inverting output terminal of the first latch, the inverting input terminal of the second latch is coupled to the non-inverting output terminal of the first latch, the non-inverting output terminal of the second latch is coupled to the non-inverting input terminal of the first latch, and the inverting output terminal of the second latch is coupled to the inverting input terminal of the first latch; wherein signals output from the non-inverting output terminal and the inverting output terminal of the first latch, and signals output from the non-inverting output terminal and the inverting output terminal of the second latch are the phase signals;
    a selecting unit, coupled to the first frequency-dividing unit, for selecting one of the phase signals according to a control signal to output an inner signal;
    a second frequency-dividing unit, coupled to the selecting unit, for dividing the frequency of the inner signal to serve as an output signal; and
    a counting unit, coupled to the selecting unit, for counting the inner signal and outputting a counting result as the control signal.

2. The frequency divider as claimed in claim 1, wherein the selecting unit is a multiplexer.

3. The frequency divider as claimed in claim 1, wherein the counting unit is a counter.

4. The frequency divider as claimed in claim 1, wherein the second frequency-dividing unit comprises:
    a first flip-flop, having a trigger terminal, a non-inverting input terminal, a non-inverting output terminal and an inverting output terminal, wherein the trigger terminal receives the inner signal; and
    an AND gate, having a first input terminal, a second input terminal and an output terminal, wherein the first input terminal is coupled to the inverting output terminal of the first flip-flop, the second input terminal receives a reset signal, and the output terminal is coupled to the non-inverting input terminal of the first flip-flop.

5. The frequency divider as claimed in claim 1, wherein the second frequency-dividing unit comprises:
    a first flip-flop, having a trigger terminal, a non-inverting input terminal and a non-inverting output terminal, wherein the trigger terminal receives the inner signal; and
    a NAND gate, having a first input terminal, a second input terminal and an output terminal, wherein the first input terminal is coupled to the non-inverting output terminal of the first flip-flop, the second input terminal receives a reset signal, and the output terminal is coupled to the non-inverting input terminal of the first flip-flop.

6. The frequency divider as claimed in claim 1 further comprising a second flip-flop coupled between the selecting unit and the second frequency-dividing unit, wherein a trigger terminal of the second flip-flop receives the input signal.

7. The frequency divider as claimed in claim 1, wherein the counting unit further changes a counting mode thereof according to a mode signal.

8. The frequency divider as claimed in claim 7, wherein the counting mode comprises a maintaining mode, a upward mode and a downward mode.

9. The frequency divider as claimed in claim 1, wherein each time when the counting unit is triggered by the inner signal, the counting result thereof is added with an integer.

10. The frequency divider as claimed in claim 1, wherein each time when the counting unit is triggered by the inner signal, the counting result thereof is decreased with an integer.

11. A frequency divider, comprising:
    a first frequency-dividing unit, for receiving an input signal, and dividing a frequency of the input signal to output a plurality of phase signals, wherein phases of the phase signals are mutually different;
    a selecting unit, coupled to the first frequency-dividing unit, for selecting one of the phase signals according to a control signal to output an inner signal;
    a second frequency-dividing unit, coupled to the selecting unit, for dividing the frequency of the inner signal to serve as an output signal, wherein the second frequency-dividing unit comprises:
        a first flip-flop, having a trigger terminal, a non-inverting input terminal and a non-inverting output terminal, wherein the trigger terminal receives the inner signal; and
        a NAND gate, having a first input terminal, a second input terminal and an output terminal, wherein the first input terminal is coupled to the non-inverting output terminal of the first flip-flop, the second input terminal receives a reset signal, and the output terminal is coupled to the non-inverting input terminal of the first flip-flop; and
    a counting unit, coupled to the selecting unit, for counting the inner signal and outputting a counting result as the control signal.

12. The frequency divider as claimed in claim 11, wherein the first frequency-dividing unit comprises:

a first latch, having a trigger terminal, a non-inverting input terminal, an inverting input terminal, a non-inverting output terminal and an inverting output terminal, wherein the trigger terminal of the first latch receives the input signal; and a second latch, having a trigger terminal, a non-inverting input terminal, an inverting input terminal, a non-inverting output terminal and an inverting output terminal, wherein the trigger terminal of the second latch receives an inverted signal of the input signal, the non-inverting input terminal of the second latch is coupled to the inverting output terminal of the first latch, the inverting input terminal of the second latch is coupled to the non-inverting output terminal of the first latch, the non-inverting output terminal of the second latch is coupled to the non-inverting input terminal of the first latch, and the inverting output terminal of the second latch is coupled to the inverting input terminal of the first latch;

wherein signals output from the non-inverting output terminal and the inverting output terminal of the first latch, and signals output from the non-inverting output terminal and the inverting output terminal of the second latch are the phase signals.

13. The frequency divider as claimed in claim 11, wherein the selecting unit is a multiplexer.

14. The frequency divider as claimed in claim 11, wherein the counting unit is a counter.

15. The frequency divider as claimed in claim 11, wherein the first frequency-dividing unit comprises:

a first latch, having a trigger terminal receiving the input signal;

a second latch, having a trigger terminal receiving an inverted signal of the input signal, a non-inverting input terminal coupled to an inverting output terminal of the first latch, and an inverting input terminal coupled to a non-inverting output terminal of the first latch;

a third latch, having a trigger terminal receiving the input signal, a non-inverting input terminal coupled to a non-inverting output terminal of the second latch, and an inverting input terminal coupled to an inverting output terminal of the second latch; and a fourth latch, having a trigger terminal receiving the inverted signal of the input signal, a non-inverting input terminal coupled to a non-inverting output terminal of the third latch, an inverting input terminal coupled to an inverting output terminal of the third latch, a non-inverting output terminal coupled to a non-inverting input terminal of the first latch, and an inverting output terminal coupled to an inverting input terminal of the first latch, wherein signals output from the non-inverting output terminals and inverting output terminals of the first latch, the second latch, the third latch and the fourth latch are the phase signals.

16. The frequency divider as claimed in claim 11 further comprising a second flip-flop coupled between the selecting unit and the second frequency-dividing unit, wherein a trigger terminal of the second flip-flop receives the input signal.

17. The frequency divider as claimed in claim 11, wherein the counting unit further changes a counting mode thereof according to a mode signal.

18. The frequency divider as claimed in claim 17, wherein the counting mode comprises a maintaining mode, a upward mode and a downward mode.

19. The frequency divider as claimed in claim 11, wherein each time when the counting unit is triggered by the inner signal, the counting result thereof is added with an integer.

20. The frequency divider as claimed in claim 11, wherein each time when the counting unit is triggered by the inner signal, the counting result thereof is decreased with an integer.

21. A frequency divider, comprising:

a first frequency-dividing unit, for receiving an input signal, and dividing a frequency of the input signal to output a plurality of phase signals, wherein phases of the phase signals are mutually different, the first frequency-dividing unit comprises:

a first latch, having a trigger terminal receiving the input signal;

a second latch, having a trigger terminal receiving an inverted signal of the input signal, a non-inverting input terminal coupled to an inverting output terminal of the first latch, and an inverting input terminal coupled to a non-inverting output terminal of the first latch;

a third latch, having a trigger terminal receiving the input signal, a non-inverting input terminal coupled to a non-inverting output terminal of the second latch, and an inverting input terminal coupled to an inverting output terminal of the second latch; and a fourth latch, having a trigger terminal receiving the inverted signal of the input signal, a non-inverting input terminal coupled to a non-inverting output terminal of the third latch, an inverting input terminal coupled to an inverting output terminal of the third latch, a non-inverting output terminal coupled to a non-inverting input terminal of the first latch, and an inverting output terminal coupled to an inverting input terminal of the first latch, wherein signals output from the non-inverting output terminals and inverting output terminals of the first latch, the second latch, the third latch and the fourth latch are the phase signals;

a selecting unit, coupled to the first frequency-dividing unit, for selecting one of the phase signals according to a control signal to output an inner signal;

a second frequency-dividing unit, coupled to the selecting unit, for dividing the frequency of the inner signal to serve as an output signal; and a counting unit, coupled to the selecting unit, for counting the inner signal and outputting a counting result as the control signal.

22. The frequency divider as claimed in claim 21, wherein the selecting unit is a multiplexer.

23. The frequency divider as claimed in claim 21, wherein the counting unit is a counter.

24. The frequency divider as claimed in claim 21, wherein the second frequency-dividing unit comprises:

a first flip-flop, having a trigger terminal, a non-inverting input terminal, a non-inverting output terminal and an inverting output terminal, wherein the trigger terminal receives the inner signal; and an AND gate, having a first input terminal, a second input terminal and an output terminal, wherein the first input terminal is coupled to the inverting output terminal of the first flip-flop, the second input terminal receives a reset signal, and the output terminal is coupled to the non-inverting input terminal of the first flip-flop.

25. The frequency divider as claimed in claim 21, wherein the second frequency-dividing unit comprises:

a first flip-flop, having a trigger terminal, a non-inverting input terminal and a non-inverting output terminal, wherein the trigger terminal receives the inner signal; and a NAND gate, having a first input terminal, a second input terminal and an output terminal, wherein the first input terminal is coupled to the non-inverting output terminal of the first flip-flop, the second input terminal receives a reset signal, and the output terminal is coupled to the non-inverting input terminal of the first flip-flop.

26. The frequency divider as claimed in claim 21 further comprising a second flip-flop coupled between the selecting unit and the second frequency-dividing unit, wherein a trigger terminal of the second flip-flop receives the input signal.

27. The frequency divider as claimed in claim 21, wherein the counting unit further changes a counting mode thereof according to a mode signal.

28. The frequency divider as claimed in claim 27, wherein the counting mode comprises a maintaining mode, a upward mode and a downward mode.

29. The frequency divider as claimed in claim 21, wherein each time when the counting unit is triggered by the inner signal, the counting result thereof is added with an integer.

30. The frequency divider as claimed in claim 21, wherein each time when the counting unit is triggered by the inner signal, the counting result thereof is decreased with an integer.

* * * * *